(12) United States Patent
Peng et al.

(10) Patent No.: US 11,374,596 B2
(45) Date of Patent: Jun. 28, 2022

(54) ALGEBRAIC DECODING METHOD AND DECODER FOR (N,N(N-1),N-1)-PGC IN COMMUNICATION MODULATION SYSTEM

(71) Applicant: HUAZHONG UNIVERSITY OF SCIENCE AND TECHNOLOGY, Hubei (CN)

(72) Inventors: Li Peng, Hubei (CN); Si Jia Chen, Hubei (CN); Ying Long Shi, Hubei (CN); Ya Yu Gao, Hubei (CN); Bin Dai, Hubei (CN); Lin Zhang, Hubei (CN); Kun Liang, Hubei (CN); Bo Zhou, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 312 days.

(21) Appl. No.: 16/727,936

(22) Filed: Dec. 27, 2019

(65) Prior Publication Data
US 2020/0287570 A1  Sep. 10, 2020

(51) Int. Cl.
*H03M 13/37* (2006.01)
*H03M 13/00* (2006.01)
(Continued)

(52) U.S. Cl.
CPC ......... *H03M 13/3761* (2013.01); *G06F 17/11* (2013.01); *G06F 17/16* (2013.01)

(58) Field of Classification Search
CPC ........... H03M 13/3761; H03M 7/4012; H03M 7/6011; G06F 17/11; G06F 17/16; H04L 27/36
See application file for complete search history.

(56) References Cited

U.S. PATENT DOCUMENTS 10,230,397 B2 *  3/2019  Peng ..................... H03M 13/15
11,038,738 B2 *  6/2021  Peng ........................ H04L 27/36

OTHER PUBLICATIONS

L. Peng, "The Generation of $(n,n(n-1),n-1)$ Permutation Group Codes for Communication Systems," in IEEE Transactions on Communications, vol. 67, No. 7, pp. 4535-4549, Jul. 2019, doi: 10.1109/TCOMM.2019.2902149. (Year: 2019).*

(Continued)

*Primary Examiner* — Justin R Knapp
(74) *Attorney, Agent, or Firm* — JCIPRNET

(57) ABSTRACT

The disclosure discloses an algebraic decoding method and a decoder for a (n, n(n−1), n−1) permutation group code in a communication modulation system. The basic principle of the decoding method is: assuming that two code elements $p(r_1)=s_1$ and $p(r_2)=s_2$ can be correctly detected in a received real vector with a length of n, including their element values $s_1$, $s_2$ and position indices $r_1$, $r_2$ in the vector, an intermediate parameter w is determined by solving an equation $(r_1-r_2)w=(s_1-s_2)(\bmod n)$; and each code element is calculated by w according to $p(i)=(s_1+(n-r_1+i)w)(\bmod n)$, $i=1, 2, \ldots, n$. The decoder is mainly composed of multiple n-dimensional registers, a w calculator, n code element calculators, and a code element buffer. In the disclosure, in a case where a receiver only correctly detects two code elements in a transmitted codeword with a length of n, the codeword can be correctly decoded by using the received information of the two code elements.

11 Claims, 7 Drawing Sheets

(51) Int. Cl.
*G06F 17/11* (2006.01)
*G06F 17/00* (2019.01)
*G06F 17/16* (2006.01)

(56) References Cited

OTHER PUBLICATIONS

Peng, L. (2016), (n, n(n-1), n-1) Permutation group codes. Electron. Lett., 52: 706-708. https://doi.org/10.1049/el.2015.3997 (Year: 2016).*

* cited by examiner

ALGEBRAIC DECODING METHOD AND DECODER FOR (N,N(N−1),N−1)-PGC IN COMMUNICATION MODULATION SYSTEM

CROSS REFERENCE TO RELATED APPLICATION

This application claims the priority benefits of China application serial no. 201910166236.5, filed on Mar. 26, 2019. The entirety of the above-mentioned patent application is hereby incorporated by reference herein and made a part of specification.

TECHNICAL FIELD

The disclosure belongs to the field of channel coding modulation technology in communication transmission, and more particularly relates to an algebraic decoding method and a decoder for a (n, n(n−1), n−1) permutation group code (PGC) in a communication modulation system.

DESCRIPTION OF THE RELATED ART

A patent application entitled "CONSTRUCTION METHOD FOR (n, n(n−1), n−1) PERMUTATION GROUP CODE BASED ON COSET PARTITION AND CODEBOOK GENERATOR THEREOF" was filed in the China National Intellectual Property Administration (CNIPA) on Jan. 27, 2016 with the application No.: 201610051144.9. In addition, a patent application entitled "CONSTRUCTION METHOD FOR (n, n(n−1), n−1) PERMUTATION GROUP CODE BASED ON COSET PARTITION AND CODEBOOK GENERATOR THEREOF" was filed in the United States Patent and Trademark Office (USTPO) with the application Ser. No. 15/060,111, and has been granted patent right. Based on the construction method for (n, n(n−1), n−1) permutation group code based on coset partition, the disclosure proposes a complete algebraic decoding method and a principle circuit structure of the corresponding decoder based on the original optimized minimum Euclidean distance decoding algorithm.

At present, it has been found that when a general permutation code is combined with multi-dimensional frequency shift keying (MFSK) modulation to form a PC-MFSK coded modulation system, the modulation system not only has a strong robustness to multiple mixed interferences including multipath fading, permanent narrow-band noise, broadband impulse noise and colored background noise which exist in a power line channel, but also features a strong anti-interference capability for mixed interferences including multipath fading, multi-user interference, multi-frequency interference and deliberate jamming in a wireless communication channel. If the (n, n(n−1), n−1) permutation group code based on coset partition proposed by the inventors is combined with the MFSK to form a new PGC-MFSK coded modulation transceiver system, the transceiver system not only has the capability of resisting multi-frequency interference and multipath fading, but also has low-complexity coding and decoding schemes, which provides an effective solution for application scenarios of the future 5G requiring measurement and control signal transmission in ultra-high reliability, ultra-low latency and low data rate. However, in the existing PGC-MFSK coded modulation transceiver system, there is no effective decoding algorithm for the permutation group code, and there is also no specific implementation scheme of the corresponding decoder. In particular, due to the lack of algebraic coding and decoding schemes for the permutation code, a random permutation code is used in most of the research results on permutation code applications.

SUMMARY

For the group algebraic structure of the (n, n(n−1), n−1) permutation group code based on coset partition, the disclosure provides a complete algebraic decoding method and a decoder thereof. More specifically, there is provided a complete algebraic decoding algorithm for a permutation group code with a code length of n, a minimum distance of n−1, a cardinality of n(n−1) and an error-correcting capability of d−1=n−2, and a corresponding decoder. The decoder provided by the disclosure can not only has the strong capability for resisting multiple mixed interferences including multipath fading, permanent narrow-band noise, broadband impulse noise and colored background noise in a power line channel, but also features a anti-interference capability for interferences including multipath fading, multi-harmonic interference, multiple random user interference and deliberate jamming in a wireless communication channel. In summary, in an operating environment where the data transmission rate requirement is not high but various mixed frequency interferences and deep fading coexist, a transmitted signal can be correctly decoded by the decoding method of the (n, n(n−1), n−1) permutation group code based on coset partition provided by the disclosure.

In order to achieve the above objective, according to an aspect of the disclosure, there is provided an algebraic decoding method for a (n, n(n−1), n−1) permutation group code (PGC) in a communication modulation system, in which when n is a prime number, the (n, n(n−1), n−1) permutation group code includes n(n−1) permutation codewords, each permutation codeword includes n code elements, and a minimum Hamming distance between any two permutation codes is n−1, the algebraic decoding method comprising: i) determining an intermediate parameter w: let $w \in Z_n$ be obtained by solving an expression $(r_1 - r_2)w = (s_1 - s_2)(\bmod n)$, where (mod n) represents a modulo n operation; let $p(r_1) = s_1$ and $p(r_2) = s_2$ be two code elements correctly detected in a real vector received from a channel, where $s_1$, $s_2 \in Z_n$ are respectively element values of the code elements $p(r_1)$ and $p(r_2)$, $r_1, r_2 \in Z_n$ are respectively position indices of the code elements $p(r_1)$ and $p(r_2)$, and $Z_n$ is a positive integer finite domain represented by $Z_n = \{1, 2, \ldots, n\}$; and both the code elements $p(r_1)$ and $p(r_2)$ are elements in a permutation codeword p with a code length of n; ii) calculating respective code elements in the permutation codeword p by using the intermediate parameter w determined in i) and the detected parameters $r_1$ and $s_1$ according to an expression $p(i) = (s_1 + (n - r_1 + i)w)(\bmod n)$, where p(i) represents an element value of a code element at a position index i, and i=1, 2, ..., n; and iii) constructing a vector with a length of n by arranging the n code elements calculated in ii) in an order of i=1, 2, ..., n, to obtain a decoded codeword p=[p(1)p(2) ... p(n−1)p(n)].

According to another aspect of the disclosure, there is provided a decoder for a (n, n(n−1), n−1) permutation group code in a communication modulation system, comprising a plurality of independent n-dimensional registers, an intermediate parameter w calculator, n single-code-element calculators operating in parallel, and a n-dimensional buffer for n code elements, wherein the plurality of independent n-dimensional registers are respectively configured to store parameters $r_1, r_2, s_1, s_2$, n and a code element position index i; two code elements $p(r_1) = s_1$ and $p(r_2) = s_2$ are correctly detected in a real vector received from a channel, where $s_1$, $s_2 \in Z_n$ are respectively element values of the code elements $p(r_1)$ and $p(r_2)$, $r_1, r_2 \in Z_n$ are respectively position indices of the code elements $p(r_1)$ and $p(r_2)$, and $Z_n$ is a positive integer finite domain represented by $Z_n=\{1, 2, \ldots, n\}$; both the code elements $p(r_1)$ and $p(r_2)$ are elements in a permutation codeword p with a code length of n; the intermediate parameter w calculator is configured to calculate an intermediate parameter w; let $w \in Z_n$ be obtained by solving an expression $(r_1-r_2)w=(s_1-s_2)(\mod n)$, where (mod n) represents a modulo n operation; the intermediate parameter w calculator is implemented by a calculator with a divider, or is implemented by a calculator with carry adders and a counter to form a simplified intermediate parameter w calculator; the n single-code-element calculators are configured to operate in parallel to simultaneously calculate n code elements in the permutation codeword p by using the intermediate parameter w and the detected parameters $r_1$ and $s_1$ according to an expression $p(i)=(s_1+(n-r_1+i)w) (\mod n)$, where p(i) represents an element value of a code element at a position index i, i=1, 2, ..., n, and a i-th single-code-element calculator is configured to calculate p(i); each of the n single-code-element calculators is implemented by a calculator with a multiplier, or a calculator with an accumulator and a counter to form a simplified single-code-element calculator; and the n-dimensional buffer for n code elements are configured to store and arrange the n code elements calculated by the n single-code-element calculators in an order of i=1, 2, ..., n to construct a vector with a length of n, thereby obtaining a decoded codeword $p=[p(1)p(2) \ldots p(n-1)p(n)]$.

Optionally, when the intermediate parameter w calculator is implemented by the calculator with the divider, the intermediate parameter w calculator includes four independent n-dimensional registers, two two-input adders, a divider and a modulo n operator mod n, wherein the four independent n-dimensional registers are configured to respectively store $r_1$, $r_2$, $s_1$ and $s_2$; two input ends of the left one of the two input adders are respectively connected to the two registers storing $r_1$ and $-r_2$, and two input ends of the right one of the two input adders are respectively connected to the two registers storing $s_1$ and $-s_2$; a left input end of the divider is configured to receive an output $(r_1-r_2)$ of the left adder, a right input end of the divider is configured to receive an output $(s_1-s_2)$ of the right adder, and the divider outputs a result $(s_1-s_2)/(r_1-r_2)$; and the modulo n operator mod n is connected to an output end of the divider, and is configured to perform an modulo operation on the result $(s_1-s_2)/(r_1-r_2)$ output by the divider and output $w=(s_1-s_2)/(r_1-r_2)(\mod n)$.

Optionally, the intermediate parameter w calculator calculates the intermediate parameter w by following steps: inputting the position values $r_1$, $r_2$ and the element values $s_1$, $s_2$ of the two known code elements $p(r_1)=s_1$ and $p(r_2)=s_2$, and initializing the intermediate parameter w=1; respectively calculating $u=r_1-r_2$ and $v=s_1-s_2$; respectively determining values of u and v: if u>0, directly outputting a value of u, and if u<0, then u=n+u, outputting a value of u; similarly, if v>0, directly outputting a value of v, and if v<0, then v=n+v, outputting a value of v; and comparing the values of u and v, if u=v, then outputting w=1; if u≠v, then u=u+u, w=w+1, comparing the values of u and v again, if u≠v, continuing the operations of u=u+u and w=w+1, until u=v, then outputting w>1.

Optionally, when the intermediate parameter w calculator is implemented by the calculator with carry adders and the counter to form a simplified calculator, the intermediate parameter w calculator includes five n-dimensional registers, two adders with carry bit C, two single-input and double-output switches, two two-input adders, a comparator, an enable control accumulator, and an enable control counter with feedback-plus-one operation, wherein the five n-dimensional registers are respectively store $r_1$, $-r_2$, $s_1$, $-s_2$ and n; the enable control counter with a feedback-plus-one operation has an initial value set to w=1; output ends of the two registers storing $r_1$ and $-r_2$ are respectively connected to two input ends of the left adder with carry bit $C_1$ to obtain a calculation result $u=r_1-r_2$, if u<0, then the carry bit $C_1=1$, the left single-input and double-output switch is thrown to the right, u is output to the left two-input adder to achieve u=n+u, and u is output; if u>0, then the carry bit $C_1=0$, the left single-input and double-output switch is thrown to the left, and $u=r_1-r_2$ is output; u enters the comparator through the enable control accumulator; output ends of the two registers storing $s_1$ and $-s_2$ are respectively connected to two input ends of the right adder with carry bit $C_2$ to obtain a calculation result $v=s_1-s_2$, if v<0, then the carry bit $C_2=1$, the right single-input and double-output switch is thrown to the left, v is output to the right two-input adder to achieve v=n+v, and v is output; if u>0, then the carry bit $C_2=0$, the right single-input and double-output switch is thrown to the right, and $v=s_1-s_2$ is output; v directly enters the comparator; and the comparator compares values of u and v: if u=v, then a low-level enable signal is output, so that the enable control counter has an enable signal $\overline{E_2}=1$, and directly outputs w=1 without the feedback-plus-one operation; if u≠v, the enable control accumulator has an enable signal $E_1=1$, and returns the current u to its input end for accumulating u once, if $E_1=0$, the enable control accumulator directly outputs u to the comparator without performing the accumulation operation; if u≠v, the enable control counter has an enable signal $E_2=1$, so that the feedback-plus-one operation is performed on the current w; as long as u≠v, the comparator, the enable control accumulator and the enable control counter repeat the above operations until u=v, resulting in $\overline{E_2}=1$, and $E_1=0$, that is, the enable control accumulator does not perform the accumulation operation and the enable control counter does not perform the feedback-plus-one operation, and then a value of w is output.

Optionally, when each of the n single-code-element calculators is implemented by the calculator with the multiplier, the i-th single-code-element calculator with the multiplier includes five independent n-dimensional registers, a three-input adder, a two-input multiplier, a two-input adder and a modulo n operator, wherein the five independent n-dimensional registers are configured to respectively store i, n, $-r_1$, w and $s_1$; output ends of the three registers storing i, n and $-r_1$ are respectively connected to three input ends of the three-input adder, and the three-input adder is configured to perform an add operation of $(n-r_1+i)$; an output end of the three-input adder is connected to one input end of the two-input multiplier, the other input end of the two-input multiplier is connected to the register storing w, and the two-input multiplier is configured to perform an multiply operation of $(n-r_1+i)w$; an output end of the two-input multiplier is connected to one input end of the two-input adder, the other input end of the two-input adder is connected to the register storing $s_1$, and the two-input adder is configured to perform an add operation of $(s_1+(n-r_1+i)w)$; and an output end of the two-input adder is connected to the modulo n operator, and the modulo n operator is configured to perform an mod n operation on $(s_1+(n-r_1+i)w)$, and output an i-th code element p(i) in the decode codeword.

Optionally, when each of the n single-code-element calculators is implemented by the calculator with the accumulator and the counter to form a simplified single-code-element calculator, the i-th simplified single-code-element calculator includes four n-dimensional registers, a three-input adder, an enable control accumulator, a counter with an intermediate parameter w cycle-minus-one operation, a two-input adder and a modulo n operator, wherein the four n-dimensional registers are configured to respectively store i, n, $-r_1$ and $s_1$; output ends of the three registers storing i, n and $-r_1$ are respectively connected to three input ends of the three-input adder to achieve an add operation of $(n-r_1+i)$; an operation result of the three-input adder is input to the enable control accumulator to achieve w times of accumulation of $(n-r_1+i)$, wherein an operation of w−1 is performed for each accumulation; when w≠0, the enable control accumulator has an enable signal E=1, so that the enable control accumulator continues to perform the accumulation operation on $(n-r_1+i)$, until w is reduced to 0, and then the enable control accumulator has an enable signal E=0, so that the accumulator stops the accumulation operation and outputs a result to one input end of the two-input adder; the other input end of the two-input adder is connected to the register storing $s_1$, and the two-input adder is configured to perform an add operation of $(s_1+(n\ r_1+i)w)$; and an output end of the two-input adder is connected to connected to the modulo n operator, and the modulo n operator is configured to perform an mod n operation on $(s_1+(n-r_1+i)w)$, and output an i-th code element p(i) in the decode codeword.

Optionally, the decoder includes an intermediate parameter w calculator, n single-code-element calculators and a n-input and single-output buffer, wherein the intermediate parameter w calculator is implemented by the calculator with the divider in FIG. 2, or the simplified intermediate parameter w calculator in FIG. 4; and each of the n single-code-element calculators is implemented by the single-code-element calculator with the multiplier in FIG. 5, or the simplified single-code-element calculator in FIG. 6.

As an alternative, the architecture of the complete algebraic decoder is mainly composed of a simplified w calculator, n simplified single-code-element calculators operating in parallel, and a n-input and single-output buffer.

Since the general permutation code has an error-correcting capability of d−1 rather than (d−1)/2 in the conventional error correction code, it can naturally be inferred that the (n, n(n−1), n−1) permutation group code has an error-correcting capability of d 1=n−2. This error-correcting capability indicates that any (n, n(n−1), n−1) permutation group code has the working principle that when the transmitter transmits a codeword having n code elements to a channel in which there exist mixed interferences, n−2 code elements in the codeword with a code length of n carrying the information are destroyed and the receiver only correctly detects two code elements, then the receiver can correctly decode the transmitted codeword by using the information of the two received code elements.

The inventors have conducted in-depth research on the algebraic structure of the (n, n(n−1), n−1) permutation group code based on coset partition, and propose a complete algebraic decoding scheme in a case of two known code elements, as well as a principle structure design of the decoder in the decoding scheme. The decoding technique in the disclosure is applicable to any signal transmission scenario with low data rate requirement where multipath fading, multi-frequency interference, multi-pulse interference, multiple random user interference and deliberate jamming exist alone or coexist in a wired or wireless channel.

In general, by comparing the above technical solution of the present inventive concept with the prior art, the present disclosure has the following beneficial effects:

The disclosure discloses an algebraic decoding method and a decoder for a (n, n(n−1), n−1) permutation group code in a communication modulation system. When the transmitter transmits a codeword having n code elements to a channel in which there exist mixed interferences, n−2 code elements in the codeword with a code length of n carrying the information are destroyed and the receiver only correctly detects two code elements, including their element values and position indices in the received codeword, then the receiver can correctly decode the transmitted codeword by using the information of the two received code elements. The decoding method for (n, n(n−1), n−1) permutation group code provided by the present invention has high accuracy and low complexity.

DETAILED DESCRIPTION OF THE EMBODIMENTS

Figure 1:
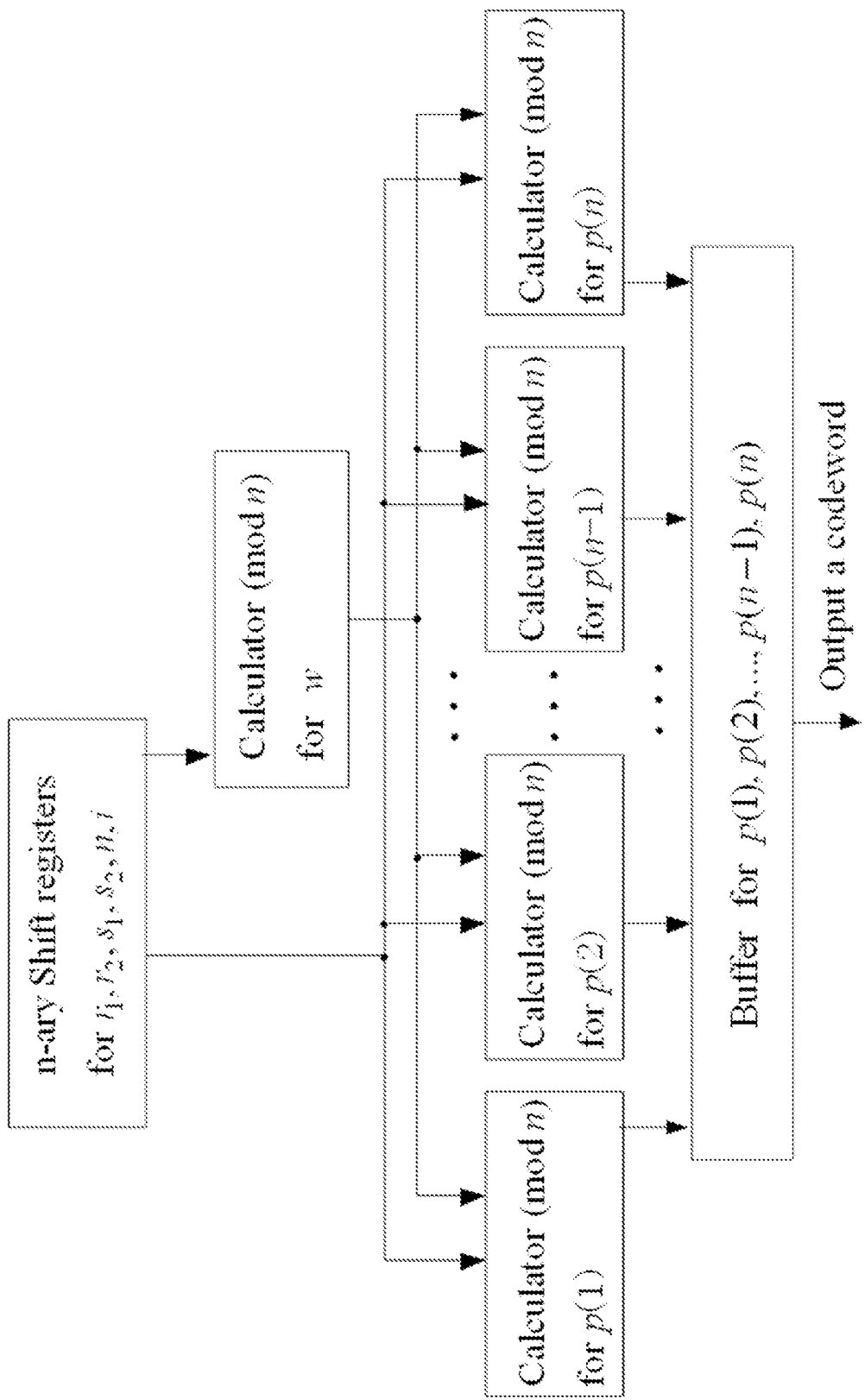
FIG. 1 is a schematic structural diagram of a complete algebraic decoder provided by the disclosure.

For clear understanding of the objectives, features and advantages of the present disclosure, detailed description of the present disclosure will be given below in conjunction with accompanying drawings and specific embodiments. It should be noted that the embodiments described herein are only meant to explain the present disclosure, and not to limit the scope of the present disclosure. Furthermore, the technical features related to the embodiments of the disclosure described below can be mutually combined if they are not found to be mutually exclusive.

Basic Principles

Basic principles of a (n, n(n−1), n−1) permutation group code of the disclosure are described below.

Assuming that code symbols can take values in a positive integer finite domain $Z_n=\{1, 2, \ldots, n\}$ or an integer finite domain $Z_n^0=\{0, 1, 2, \ldots, n-1\}$, but a description with values mainly taken in $Z_n=\{1, 2, \ldots, n\}$ is given, and the result also applies to the case where values are taken in $Z_n^0=\{0, 1, 2, \ldots, n-1\}$.

Calling a set formed by all n! permutations of n elements in $Z_n$ a symmetric group $S_n=\{\pi_1, \ldots, \pi_k, \ldots, \pi_{n!}\}$, an element in $S_n$ may be represented by a permutation vector $\pi_k=[a_1 \ldots a_i \ldots a_n]$. All elements of a permutation are different and represented by $a_1, \ldots, a_i, \ldots, a_n \in Z_n$. Degree (dimension, size) of a permutation is $|\pi_k|=n$, and cardinality (order) of the symmetric group is $|S_n|=n!$. Let $\pi_0=e=[a_1\ a_2 \ldots a_n]=[12 \ldots n]$ represent an identity element of the symmetric group $S_n$. A general permutation group code is defined as a subgroup of the symmetric group $s_n$, and expressed as (n, μ, d)–PGC, where n represents a code length, μ represents the maximum cardinality (maximum size) of the code set, and d represents a minimum Hamming distance between any two permutation codewords in the code set. For example, a (n, n(n−1), n−1) permutation group code is a group code with a code length of n, a cardinality of n(n−1) and a minimum Hamming distance of n−1.

The existing published research results show that a code set $P_{n,x_i}$ of a (n, μ, d) permutation group code (n>1) can be equivalently obtained by calculating each code by the following three methods.

$$P_{n,x_i} = \{p_1, p_2, \ldots, p_{n(n-1)}\}_{x_i} \quad (1)$$
$$= S_n \cap \{C_n \circ L_{n,x_i}\} = S_n \cap \{\{c_i \circ l_{j,x_i}\}_{i=1}^n\}_{j=1}^{n-1}$$
$$= S_n \cap \{a(p_{1,x_i} - x_i) + x_i + b \mid a \in Z_{n-1}, x_i, b \in Z_n, p_{1,x_i} = \quad (2\text{-}1)$$
$$[1 \ldots n]\}$$
$$= S_n \cap \{L_{n,x_i} + b \mid b \in Z_n\} \quad (2\text{-}2)$$
$$= S_n \cap \{(t_{rn})^{n-1} L_{n,x_i}\} = S_n \cap \{(t_{l1})^{n-1} L_{n,x_i}\} \quad (3)$$

where the expression (1) represents a first method for generating the code set $P_{n,x_i}$, indicating that the code set $P_{n,x_i}$ is composed by two smaller subgroups (i.e., a special cyclic subgroup $C_n$ with a cardinality of $|C_n|=n$ and a largest single fixed point subgroup $L_{n,x_i}$) with an operator "∘"; the expressions (2-1) and (2-2) represent a second method for generating the code set $P_{n,x_i}$, indicating that each permutation codeword in the code set $P_{n,x_i}$ can be calculated by affine transformation $f_{a,b}(p_{1,x_i})=a(p_{1,x_i}-x_i)+x_i+b$; and the expression (3) represents a third method for generating the code set $P_{n,x_i}$, indicating that $P_{n,x_i}$ can be obtained by using a (n−1)th power of cyclic-right-shift operator $(t_{rn})^{n-1}$ or an equivalent (n−1)th power of cyclic-left-shift operator $(t_{l1})^{n-1}$ to act on the largest single fixed point subgroup $L_{n,x_i}$. The fixed point $x_i \in Z_n$ indicates that all permutation vectors in the largest single fixed point subgroup $L_{n,x_i}$ contain a fixed point $x_i$ and the other code elements are non-fixed points. When n is a non-prime number, all the above-mentioned sets formed by the curly braces {•} require an intersection operation with the symmetric group $S_n$ to guarantee that each element $p_{n,x_i}$ is a permutation vector. This is because for any non-prime number n and all $a \in Z_{n-1}$, when a does not satisfy GCD(a, n)=1, the scaling transformation $f_{a,x_i}(l_{1,x_i})=a(l_{1,x_i}-x_i)+x_i$ cannot guarantee that all vectors in the set $L_{n,x_i}=\{a(l_{1,x_i}-x_i)+x_i|a \in Z_{n-1}, x_i, i \in Z_n, l_{1,x_i}=[1 \ldots n]\}$ are permutation vectors, that is, $|L_{n,x_i}|<n-1$. If and only if n is a prime number, all the sets formed by the curly braces {•} can guarantee that $P_{n,x_i}$ generated by three methods all contain n(n−1) permutation codes without the need of an intersection operation with the symmetric group $S_n$, that is, $L_{n,x_i}$ is a (n, n−1, n−1) permutation group or $|L_{n,x_i}|=n-1$. GCD (a, n) represents a greatest common divisor between $a \in Z_{n-1}$ and n, and GCD(a, n)=1 indicates that $a \in Z_{n-1}$ and n are mutually exclusive.

For any n>1, in the above three methods for generating the code set $P_{n,x_i}$ of the (n, μ, d) permutation group code, the expression (3) $P_{n,x_i}=S_n \cap \{(t_{rn})^{n-1} L_{n,x_i}\}=S_n \cap \{(t_{l1})^{n-1} L_{n,x_i}\}$ has the lowest computational complexity. For the convenience of description, the code set is hereinafter calculated by $P_{n,x_i}=S_n \cap \{(t_{l1})^{n-1} L_{n,x_i}\}$. If and only if n is a prime number, the code set $P_{n,x_i}$ is a (n, n(n−1), n−1) permutation group code.

Example 1 let n=7, which is a prime number, and let a fixed point $x_i=x_7=7$. The computation expression of $L_{7,7}$ is $L_{7,7}=\{al_{1,x_i}|a \in Z_6, l_{1,x_i}=[1234567]\}$, and thus a largest single fixed point subgroup in which the point $x_i=7$ can be calculated as follow.

$$L_{7,7} = \left\{\begin{array}{c} 1l_{1,7}, \\ 2l_{1,7}, \\ 3l_{1,7}, \\ 4l_{1,7}, \\ 5l_{1,7}, \\ 6l_{1,7} \end{array}\right\} = \left\{\begin{array}{c} l_{1,7}, \\ l_{2,7}, \\ l_{3,7}, \\ l_{4,7}, \\ l_{5,7}, \\ l_{6,7} \end{array}\right\} = \left\{\begin{array}{c} 1[1234567], \\ 2[1234567], \\ 3[1234567], \\ 4[1234567], \\ 5[1234567], \\ 6[1234567] \end{array}\right\} = \left\{\begin{array}{c} 1234567, \\ 2461357, \\ 3625147, \\ 4152637, \\ 5316427, \\ 6543217 \end{array}\right\}$$

By using the (n−1=6)th powder of the cyclic-left-shift operator $(t_{l1})^6$ to act on the largest single fixed point subgroup $L_{7,7}$, the following (7, 42, 6) permutation group code $P_{7,7}$ can be obtained:

$$P_{7,7} = \{p_1, p_2, \ldots, p_{42}\}_7 = \{(t_{l1})^6 L_{7,7}\} =$$
$$\{(t_{l1})^6 l_{1,7}, (t_{l1})^6 l_{2,7}, (t_{l1})^6 l_{3,7}, (t_{l1})^6 l_{4,7}, (t_{l1})^6 l_{5,7}, (t_{l1})^6 l_{6,7}\} =$$

$$\left\{\begin{array}{cccccc} 1234567 & 2461357 & 3625147 & 4152637 & 5316427 & 6543217 \\ 2345671 & 4613572 & 6251473 & 1526374 & 3164275 & 5432176 \\ 3456712 & 6135724 & 2514736 & 5263741 & 1642753 & 4321765 \\ 4567123 & 1357246 & 5147362 & 2637415 & 6427531 & 3217654 \\ 5671234 & 3572461 & 1473625 & 6374152 & 4275316 & 2176543 \\ 6712345 & 5724613 & 4736251 & 3741526 & 2753164 & 1765432 \\ 7123456 & 7246135 & 7362514 & 7415263 & 7531642 & 7654321 \end{array}\right\}$$

Example 1 indicates that the code set $P_{7,7}$ is a permutation group code with a code length of 7, a minimum distance of 6, a cardinality of 42 and an error-correcting capability of 5.

Assuming that the transmitter transmits a signal it carrying information to a wired or wireless channel for transmission, this signal it is mapped to a signal point in a signal constellation diagram $P_{n,x_i}$ formed by a (n, n(n−1), n−1) permutation group code, or equivalently, a signal $\pi=[a_1\ a_2\ \ldots\ a_n]$ selected from the signal constellation diagram $P_{n,x_i}$ is, as a binary information sequence of the transmitter, transmitted to a channel. Due to the interference in the channel, the receiver can only receive a vector $[\hat{a}_1\ \hat{a}_2\ \ldots\ \hat{a}_n]$ with a length of n defined in a real domain from the channel. If it is desired to use a decoding method with the optimal performance, a minimum distance decoding algorithm equivalent to maximum likelihood can be used. Since the received word is a vector defined in the real domain, the following minimum Euclidean distance decoding algorithm is employed.

Minimum Euclidean distance decoding algorithm: let the transmitter transmit a codeword $\pi=[a_1\ a_2\ \ldots\ a_n]$ selected from the code set $P_{n,x_i}$ of the (n, n(n−1), n−1) permutation group code to a channel, a received word $\hat{\pi}=[\hat{a}_1\ \hat{a}_2\ \ldots\ \hat{a}_n]$ is input to a decoder for the (n, n(n−1), n−1) permutation group code, and then the decoder calculates the Euclidean distance between the received word $\hat{\pi}=[\hat{a}_1\ \hat{a}_2\ \ldots\ \hat{a}_n]$ and each codeword in the code set $P_{n,x_i}$, and selects a codeword $\tilde{\pi}=[\tilde{a}_1\ \tilde{a}_2\ \ldots\ \tilde{a}_n]$ with the smallest Euclidean distance from the received word $\hat{\pi}=[\hat{a}_1\ \hat{a}_2\ \ldots\ \hat{a}_n]$:

$$\tilde{\pi} = [\tilde{a}_1 \tilde{a}_2 \ldots \tilde{a}_n] = \arg\min_{\pi \in P_{n,x_i}} d_E(\hat{\pi}, \pi)$$

where $d_E(\hat{\pi}, \pi)$ represents the Euclidean distance between the two vectors $\hat{\pi}$ and $\pi$, i.e., $d_E(\hat{\pi}, \pi) = \sqrt{\sum_{i=1}^{n}(\hat{a}_i - a_i)^2}$. Then, $\tilde{\pi} = [a_1 \ a_2 \ \ldots \ a_n]$ is output from the decoder as an accurate estimation of the transmitted codeword $\pi = [a_1 \ a_2 \ \ldots \ a_n]$.

The computation amount of the minimum Euclidean distance decoding algorithm for the (n, n(n-1), n-1) permutation group code is: $(2n-1)n(n-1)$ additions, $n^2(n-1)$ multiplications (exponentiation) and $n(n-1)$ root square operations, and its computation complexity is at least $O(n^3)$. Due to the complexity of reaching the third power of the code length n, this decoding algorithm cannot meet the requirement of the practical communication system for the low complexity hardware implementation of the decoder. In order to find a simplified decoding algorithm with no performance loss compared to the minimum Euclidean distance decoding algorithm, it is necessary to use the characteristic of the (n, n(n-1), n-1) permutation group code that the error-correcting capability is d $1=n-2$. The following example provides a valuable insight, which laid the foundation for the inventors to propose an efficient and low-complexity decoding method for a (n, n(n-1), n-1) permutation group code. In the following, with reference to the code set $P_{7,7}$ in Example 1, it is analyzed why the error-correcting capability of the (7, 42, 6) permutation group code is d-1=n-2=5.

Example 2 assuming that the transmitter transmits a signal carrying information to a channel, this signal is mapped to a signal point p=[5147362] in the signal constellation diagram $P_{n,x_i}$. This signal is actually a codeword in line 4 and column 3 of the code set $P_{7,7}$ of the (7, 42, 6) permutation group code. Assuming that the receiver can correctly detect two code elements in the received vector with a length of n defined in the real domain (for example, an element in the 2nd position is 1, which is expressed as p(2)=1; an element in the 4-th position is 7, which is expressed as p(4)=7), the decoding algorithm in the receiver can correctly decode the transmitted codeword by the two known code elements. The reason is that the codeword in which the element in the 2nd position is 1 and the element in the 4-th position is 7 is unique in the code set $P_{7,7}$, that is, a codeword in line 4 and column 3. This example also confirms that the (n, n(n-1), n-1) permutation group code has an error-correcting capability of d-1=n-2=5, namely, if two code elements are known, the codeword can be decoded correctly.

Technical Solution

The technical solution is divided into two parts. The first part covers a decoding method for a (n, n(n-1), n-1) permutation group code based on coset partition, and the second part covers a decoder for the (n, n(n-1), n-1) permutation group code.

Part 1: a complete algebraic decoding method for a (n, n(n-1), n-1) permutation group code based on coset partition The (n, n(n-1), n-1) permutation group code based on coset partition not only can be regarded as a constellation diagram with n(n-1) modulation signal points, but also can be regarded as a non-binary, non-linear and non-systematic error-correcting code with an error-correcting capability of d-1=n-2. According to the characteristic of the error-correcting capability of d-1=n-2, we propose the following complete algebraic decoding method for the (n, n(n-1), n-1) permutation group code based on coset partition.

Complete algebraic decoding method: if and only if n is a prime number, let $p(r_1)=s_1$ and $p(r_2)=s_2$ be two code elements correctly detected from a received real vector, in which $r_1, r_2 \in Z_n$ are their position indices, and $s_1, s_2 \in Z_n$ are their element values, then all code elements in the codeword $p \in P_n$ can be calculated by the following steps:

i) Let $w \in Z_n$ be an efficient solution of an expression $(r_1-r_2)w \equiv s_1-s_2 \pmod{n}$.

ii) Calculating each element in a permutation codeword p by using the w according to the following expression:

$$p(i)=(s_1+(n-r_1+i)w)(\bmod n), \text{ where } i=1,2,\ldots,n.$$

iii) Outputting a decoded codeword $p=[p(1)p(2)\ldots p(n-1)p(n)]$.

The computation amount of this decoding method is: $2n+2$ additions, $n+1$ multiplications and $n+1$ modulo operations.

Example 3 a codeword p=[5147362] is selected from $P_{7,7}$ in Example 1, and sent to a channel. Assuming that two elements p(2)=1 and p(4)=7 are correctly detected. Firstly, according to an expression $(r_1-r_2)w \equiv s_1-s_2 \pmod n$, $(2-4)w \equiv 1-7 \pmod 7$ and $-2w \equiv -6 \pmod 7$ are obtained, thereby obtaining a solution of w=3. Then, each element in the codeword is calculated as follows:

$p(1)=(s_1+(n-r_1+1)w)(\bmod n)=(1+(7-2+1)3)(\bmod 7)=5,$ $p(2)=(s_1+(n-r_1+2)w)(\bmod n)=(1+(7-2+2)3)(\bmod 7)=1,$ $p(3)=(s_1+(n-r_1+3)w)(\bmod n)=(1+(7-2+3)3)(\bmod 7)=4,$ $p(4)=(s_1+(n-r_1+4)w)(\bmod n)=(1+(7-2+4)3)(\bmod 7)=7,$ $P(5)=(s_1+(n-r_1+5)w)(\bmod n)=(1+(7-2+5)3)(\bmod 7)=3,$ $p(6)=(s_1+(n-r_1+6)w)(\bmod n)=(1+(7-2+6)3)(\bmod 7)=6,$ $P(7)=(s_1+(n-r_1+7)w)(\bmod n)=(1+(7-2+7)3)(\bmod 7)=2.$ The decoded codeword is p=[p(1)p(2)p(3)p(4)p(5)p(6)p(7)]=[5147362], which is identical to the transmitted codeword. Therefore, the complete algebraic decoding method can achieve error-free decoding.

Part 2: a complete algebraic decoder for a (n, n(n-1), n-1) permutation group code based on coset partition The complete algebraic decoding method for a (n, n(n-1), n-1) permutation group code based on coset partition is implemented by the complete algebraic decoder.

The principle structure of the complete algebraic decoder is mainly composed of four parts, including a number of independent n-dimensional registers, a basic principle circuit of an intermediate parameter w calculator, basic principle circuits of n single-code-element calculators operating in parallel, and a n-dimensional buffer for n code elements, as shown in FIG. 1.

Figure 4:
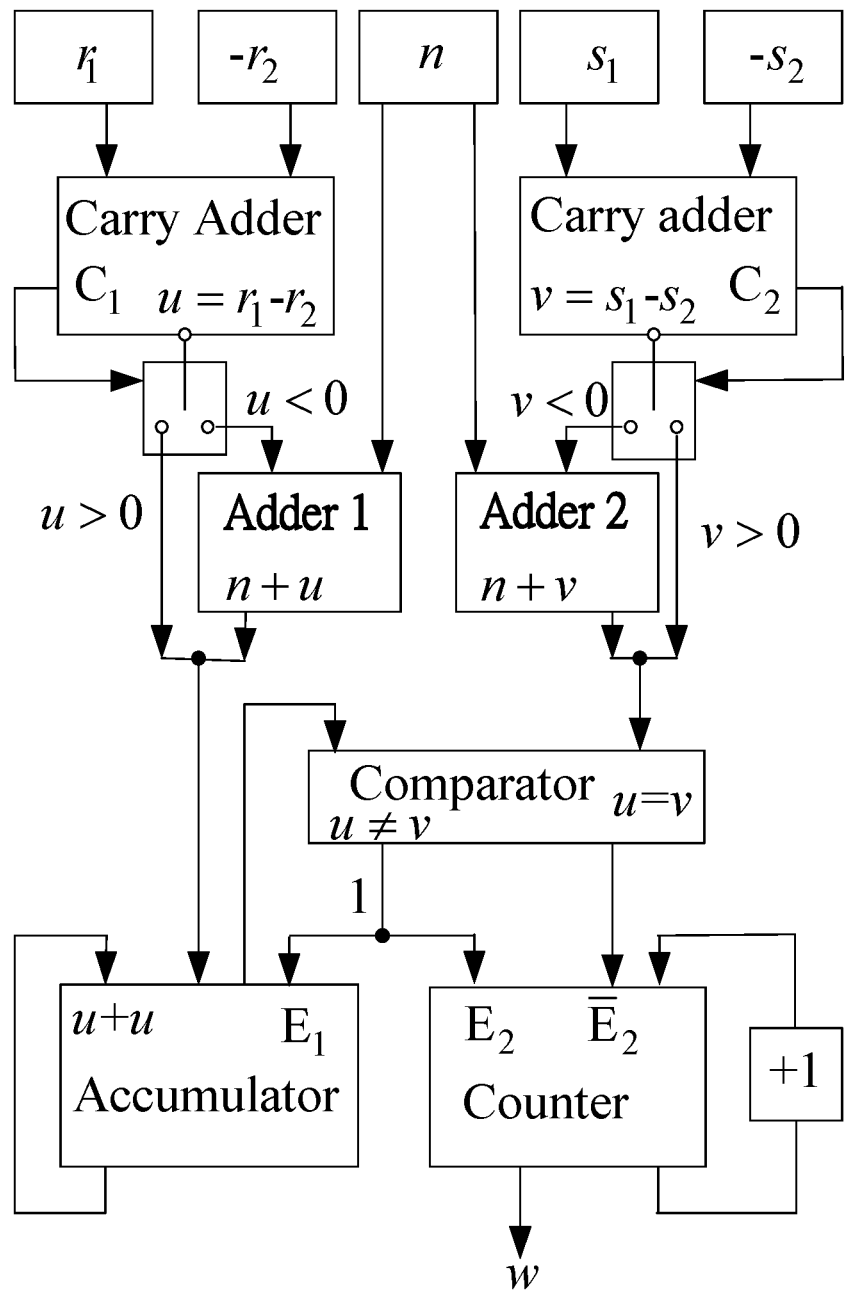
FIG. 4 is a schematic diagram of a simplified intermediate parameter w calculator provided by the disclosure.

The independent n-dimensional registers are configured to respectively store parameters $r_1, r_2, s_1, s_2$, n and a code element position index i. The basic principle circuit of the intermediate parameter w calculator may be a calculator with a divider (FIG. 2) or a simplified calculator (FIG. 4). The basic principle circuit of the single-code-element calculator may be a basic principle circuit of a single-code-element calculator with a multiplier (FIG. 5) or a basic principle circuit of a simplified single-code-element calculator (FIG. 6). The n single-code-element calculators are configured to operate in parallel to simultaneously calculate n code elements. The n-dimensional buffer for n code elements are configured to store output results of the n single-code-element calculators operating in parallel to form a permutation codeword and output it as a decoded codeword.

Figure 2:
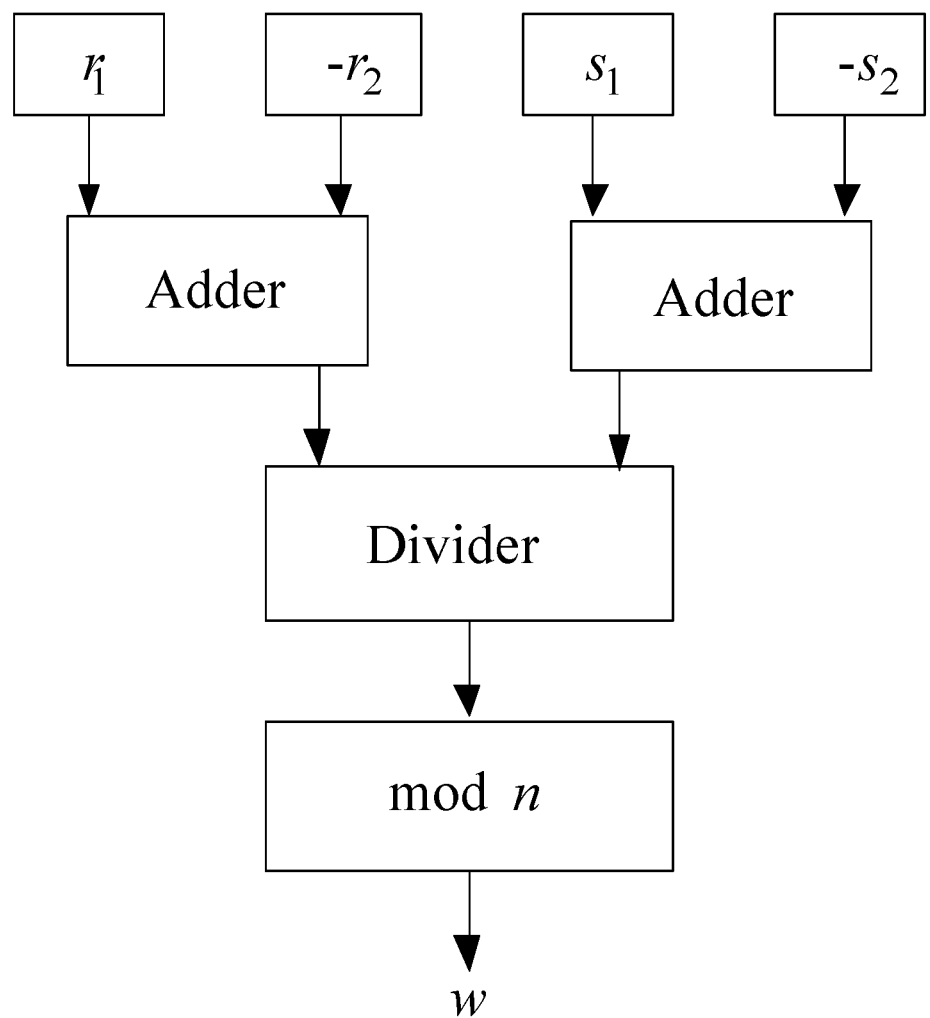
FIG. 2 is a schematic diagram of an intermediate parameter w calculator with a divider provided by the disclosure.

The basic principle circuit of the intermediate parameter w calculator with a divider is configured to calculate the intermediate parameter $w=(s_1-s_2)/(r_1-r_2)(\mod n)$, and is mainly composed of four parts: four independent n-dimensional registers, two two-input adders, a divider, and a modulo n operator mod n, as shown in FIG. 2.

The position values $r_1$, $-r_2$ and the element values $s_1$, $-s_2$ of the two known code elements $p(r_1)=s_1$ and $p(r_2)=s_2$ are stored in the four independent n-dimensional registers, $r_1$ and $-r_2$ are input to one adder, $s_1$ and $-s_2$ are input to the other adder, outputs $r_1-r_2$ and $s_1-s_2$ of the two adders are simultaneously output to the divider, and the modulo n operator mod n performs a modulo operation of the outputs $(s_1-s_2)/(r_1-r_2)$ of the divider and then outputs w. Another variation is as follow: two modulo n operators mod n are respectively disposed in front of the divider, so that $(r_1-r_2)(\mod n)$ and $(s_1-s_2)(\mod n)$ are input to the two input ends of the divider, and then the divider outputs $w=(s_1-s_2)(\mod n)/(r_1-r_2)(\mod n)$.

In order to eliminate the complicated divider and modulo n operator in the process of calculating the intermediate parameter w, a flowchart for calculating the intermediate parameter w is provided according to the working characteristics of the basic unit circuit.

Figure 3:
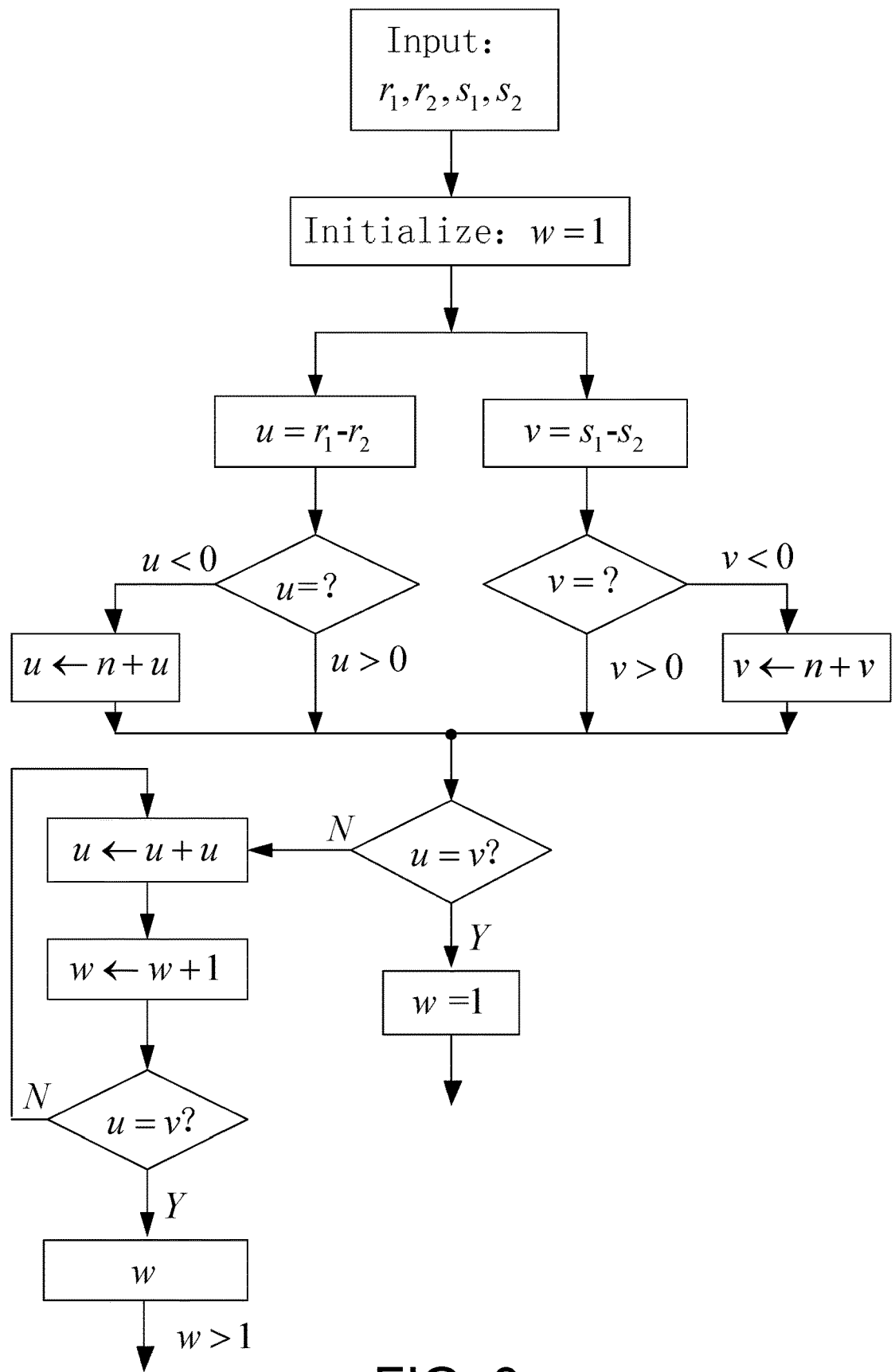
FIG. 3 is a calculation flowchart of a simplified intermediate parameter w calculator provided by the disclosure.

A flowchart for the simplified intermediate parameter w calculator: FIG. 3 shows a flowchart of the simplified calculator for solving the intermediate parameter w after removing the divider and the modulo n operator. After analyzing the calculation expression $(r_1-r_2)w=(s_1-s_2)(\mod n)$, the following features are found: firstly, $(r_1-r_2)$ and $(s_1-s_2)$ may be positive or negative numbers, and if negative, the negative number can be added with n to become a positive number, corresponding to performing a modulo n operation; secondly, when $(r_1-r_2)$ and $(s_1-s_2)$ are both positive numbers, w times of $(r_1-r_2)$ is equal to $(s_1-s_2)$; thirdly, w times of $(r_1-r_2)$ corresponds to w times of accumulation of $(r_1-r_2)$; and fourthly, when $(r_1-r_2)=(s_1-s_2)$, $w=1$. Based on these four characteristics, a simplified flowchart for calculating w can be summarized.

Position values $r_1$, $r_2$ and element values $s_1$, $s_2$ of the two known code elements $p(r_1)=s_1$ and $p(r_2)=s_2$ are input, and the intermediate parameter w is initialized to be $w=1$. $u=r_1-r_2$ and $v=s_1-s_2$ are respectively calculated. Values of u and v are respectively determined: if $u>0$, a value of u is directly output, and if $u<0$, then $u=n+u$, a value of u is output; similarly, if $v>0$, a value of v is directly output, and if $v<0$, then $v=n+v$, a value of v is output. The above process is used to replace the operation of the modulo n operator. The values of u and v are compared, if $u=v$, then $w=1$ is output; if $u\neq v$, then w times of accumulation of u are performed so that $uw=v$ ($1<w\leq n$), and w is output.

A circuit for calculating the intermediate parameter w, which is designed according to the idea of the flowchart provided in FIG. 3, falls within the protection scope of the disclosure. A basic principle circuit of a simplified intermediate parameter w calculator is provided below, but the intermediate parameter w calculator is not limited thereto.

A basic principle circuit of a simplified intermediate parameter w calculator is mainly composed of five n-dimensional registers, two adders with carry bit C, two two-input adders, a n-dimensional NAND gate comparator, an enable control accumulator, and an enable control counter with feedback-plus-one operation, as shown FIG. 4. The basic principle circuit of the simplified intermediate parameter w calculator is provided to simply the intermediate parameter w calculator in FIG. 2 by removing the divider and the modulo n operator.

Parameters $r_1$, $-r_2$, $s_1$, $-s_2$ and n are respectively stored in the five n-dimensional registers, and the counter has an initial value set to $w=1$. $r_1$, $-r_2$ and $s_1$, $-s_2$ output from the n-dimensional registers are respectively input to the two adders with carry bit C, and after the add operation, the respective double-throw switch is controlled by the value of the corresponding carry bit C.

The two adders with carry bit C are configured to respectively calculate $u=r_1-r_2$ and $v=s_1-s_2$. When $u<0$, the carry bit $C_1=1$, the corresponding double-throw switch is thrown to the right, u enters the two-input adder 1 to achieve an add operation of $n+u$, and u is output and enters the comparator through the accumulator; when $u>0$, the carry bit $C_1=0$, the corresponding double-throw switch is thrown to the left, u enters the comparator through the accumulator. When $v<0$, the carry bit $C_2=1$, the corresponding double-throw switch is thrown to the left, v enters the two-input adder 2 to achieve an add operation of $n+v$, and v is output and directly enters the comparator; when $v>0$, the carry bit $C_2=0$, the corresponding double-throw switch is thrown to the right, and v directly enters the comparator.

When the enable signal $E_1=1$, the accumulator performs an add operation of $u+u$; when the enable signal $E_1=0$, the accumulator directly output u to the comparator without performing the add operation.

The comparator compares u and v. If $u=v$, a low level enable signal $E_2=1$ is output, so that the counter directly outputs $w=1$ without performing the feedback-plus-one operation.

If $u\neq v$, the accumulator has an enable signal $E_1=1$, and returns the current output u to its input end for accumulating u once; meanwhile, the counter has an enable signal $\overline{E}_2=1$, so that the feedback-plus-one operation is performed on the current output w; as long as $u\neq v$, the comparator, the accumulator and the counter repeat the above operations until $u=v$, resulting in that $\overline{E}_2=1$, and the accumulator stops performing the feedback-plus-one operation, and outputs a value of w.

When n is not too large, the time taken to perform w times of accumulation of u does not exceed the time taken by the divider to perform an operation once, and then the simplification from FIG. 2 to FIG. 4 is practical.

Figure 5:
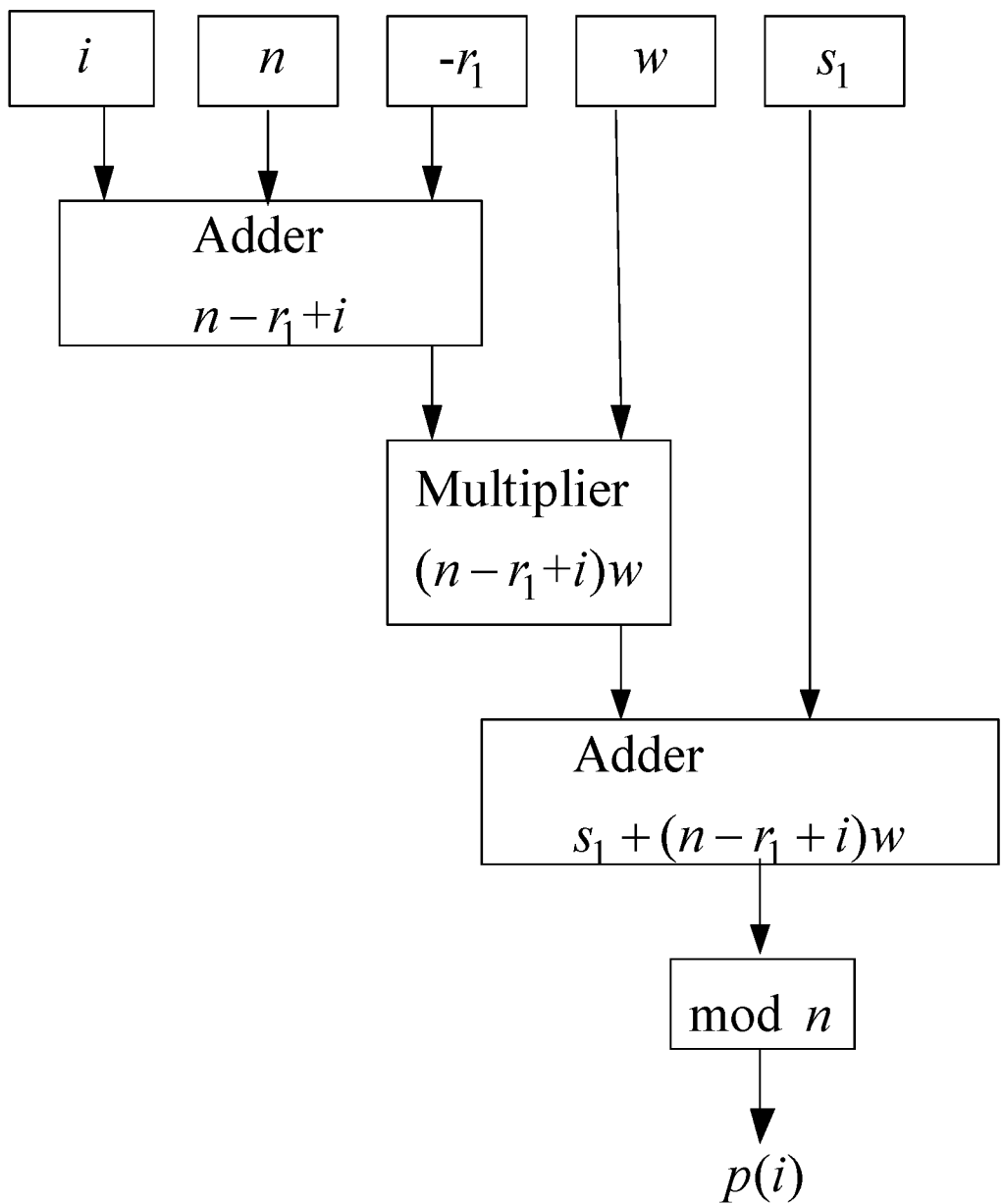
FIG. 5 is a schematic diagram of a single-code-element calculator with a multiplier provided by the disclosure.
Figure 6:
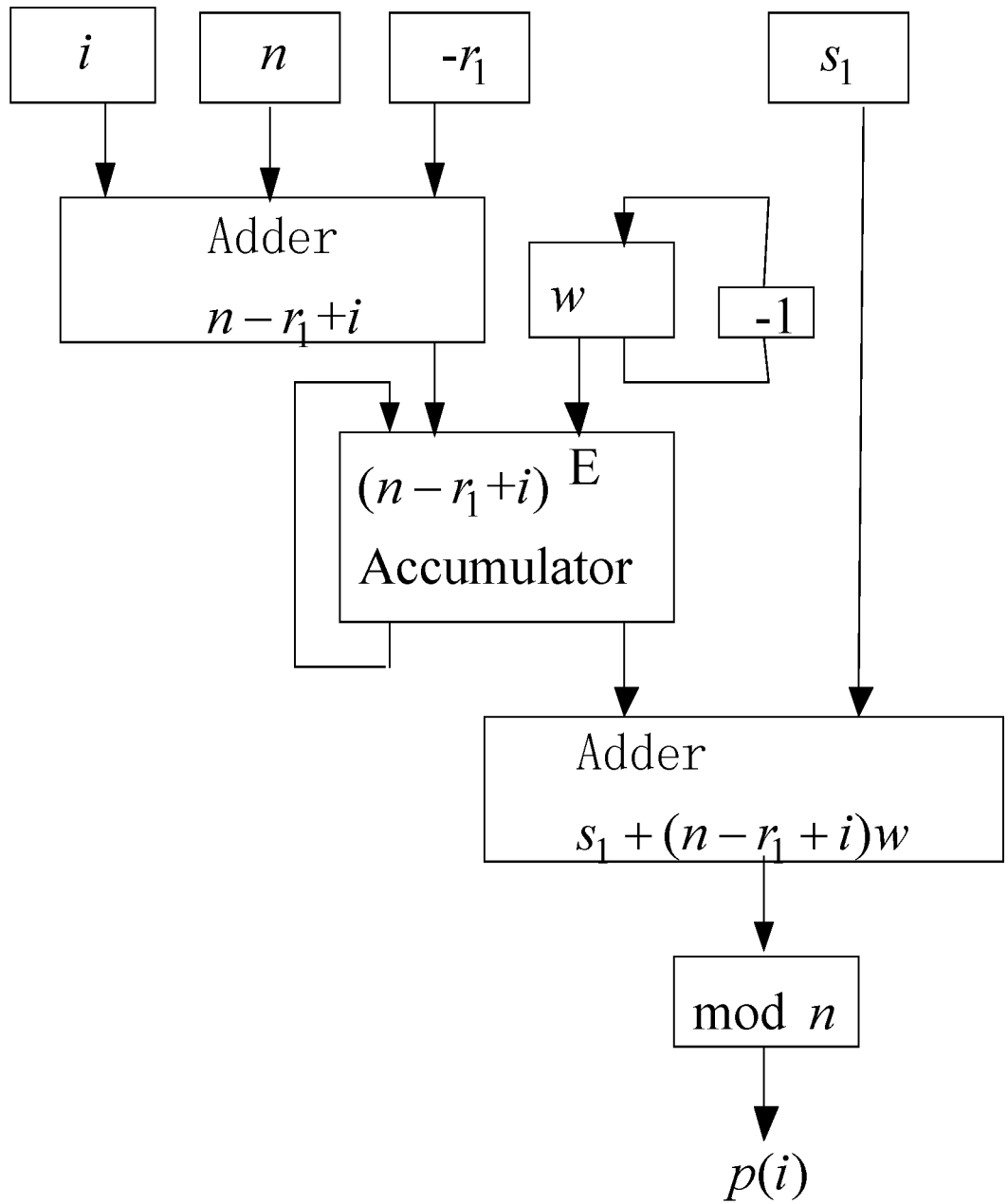
FIG. 6 is a schematic diagram of a simplified single-code-element calculator provided by the disclosure.

The basic principle circuit of the single-code-element calculator with the multiplier is mainly composed of five independent n-dimensional registers, a three-input adder, a two-input multiplier, a two-input adder and a modulo n operator, as shown FIG. 5. In a case of two known code elements, the decoder in FIG. 5 is configured to calculate each code element in the permutation code, i.e., $p(i)=(s_1+(n-r_1+i)w)(\mod n)$, $i=1, 2, \ldots, n-1$. When $i=n$, $p(n)=(s_1+(n-r_1)w)(\mod n)$.

The five independent n-dimensional registers are configured to respectively store a code element position index i, a code length n, $-r_1$, an intermediate parameter w, and $s_1$. Firstly, i, n and $-r_1$ are input to the three-input adder to achieve an add operation of $(n-r_1+i)$. Secondly, the operation result of the adder and w output from the n-dimensional register are input to the multiplier to achieve a multiply operation of $(n-r_1+i)w$. Then, the operation result of the multiplier and $s_1$ output from the n-dimensional register are input to the two-input adder to achieve an add operation of $(s_1+(n-r_1+i)w)$. Finally, a modulo n operation is performed on the operation result of the adder to output an i-th code element p(i) in the decode codeword.

In order to eliminate the complicated operation circuit of the multiplier in the process of calculating a single code element, the multiply operation of $(n-r_1+i)$ and w may be regarded as w times of accumulation of $(n-r_1+i)$, that is, the multiplier may be converted to an accumulator controlled by a counter with a cycle-minus-one operation of an intermediate parameter w.

The basic principle circuit of the simplified single-code-element calculator is mainly composed of four n-dimensional registers, a three-input adder, an enable control accumulator, a counter with a cycle-minus-one operation of an intermediate parameter w, a two-input adder and a modulo n operator, as shown in FIG. 6. In a case of two known code elements, the adder and the counter with the cycle-minus-one operation of the intermediate parameter w in FIG. 6 are used instead of the multiplier in FIG. 5 to simplify the principle circuit of the single-code-element calculator.

The four n-dimensional registers are configured to respectively store a code element position index i, a code length n, $-r_1$ and $s_1$. Firstly, i, n and $-r_1$ are input to the three-input adder to achieve an add operation of $(n-r_1+i)$. Secondly, the operation result of the adder is input to the enable control accumulator to achieve w times of accumulation of $(n-r_1+i)$, in which an operation of w-1 is performed for each accumulation; when w≠0, the accumulator has an enable signal E=1, so that the accumulator continues to perform the accumulation operation on $(n-r_1+i)$, until w is reduced to 0, and then the accumulator has an enable signal E=0, so that the accumulator stops the accumulation and outputs a result to one input end of the two-input adder. This process is equivalent to the multiply operation of $(n-r_1+i)w$. Then, the operation result of the multiplier and $s_1$ output from the n-dimensional register are input to the two-input adder to achieve an add operation of $(s_1+(n-r_1+i)w)$. Finally, a modulo n operation is performed on the operation result of the adder to output the i-th code element p(i) in the decode codeword.

When n is not too large, the time taken to perform w times of accumulation of a number does not exceed the time taken by the divider to perform an operation once, and then the simplification from FIG. 5 to FIG. 6 is practical.

The architecture of the complete algebraic decoder is mainly composed of an intermediate parameter w calculator, n single-code-element calculators and a n-input and single-output buffer. The intermediate parameter calculator may be implemented by the intermediate parameter w calculator with the divider in FIG. 2, the simplified intermediate parameter w calculator in FIG. 4, or any intermediate parameter w calculator designed according to the flowchart of the simplified intermediate parameter w calculator. The single-code-element calculator may be implemented by the single-code-element calculator with the multiplier in FIG. 5, the simplified single-code-element calculator in FIG. 6, or any calculating circuit designed to achieve $p(i)=(s_1+(n-r_1+i)w)(\text{mod } n)$ (i=1, 2, . . . , n-1).

Figure 7:
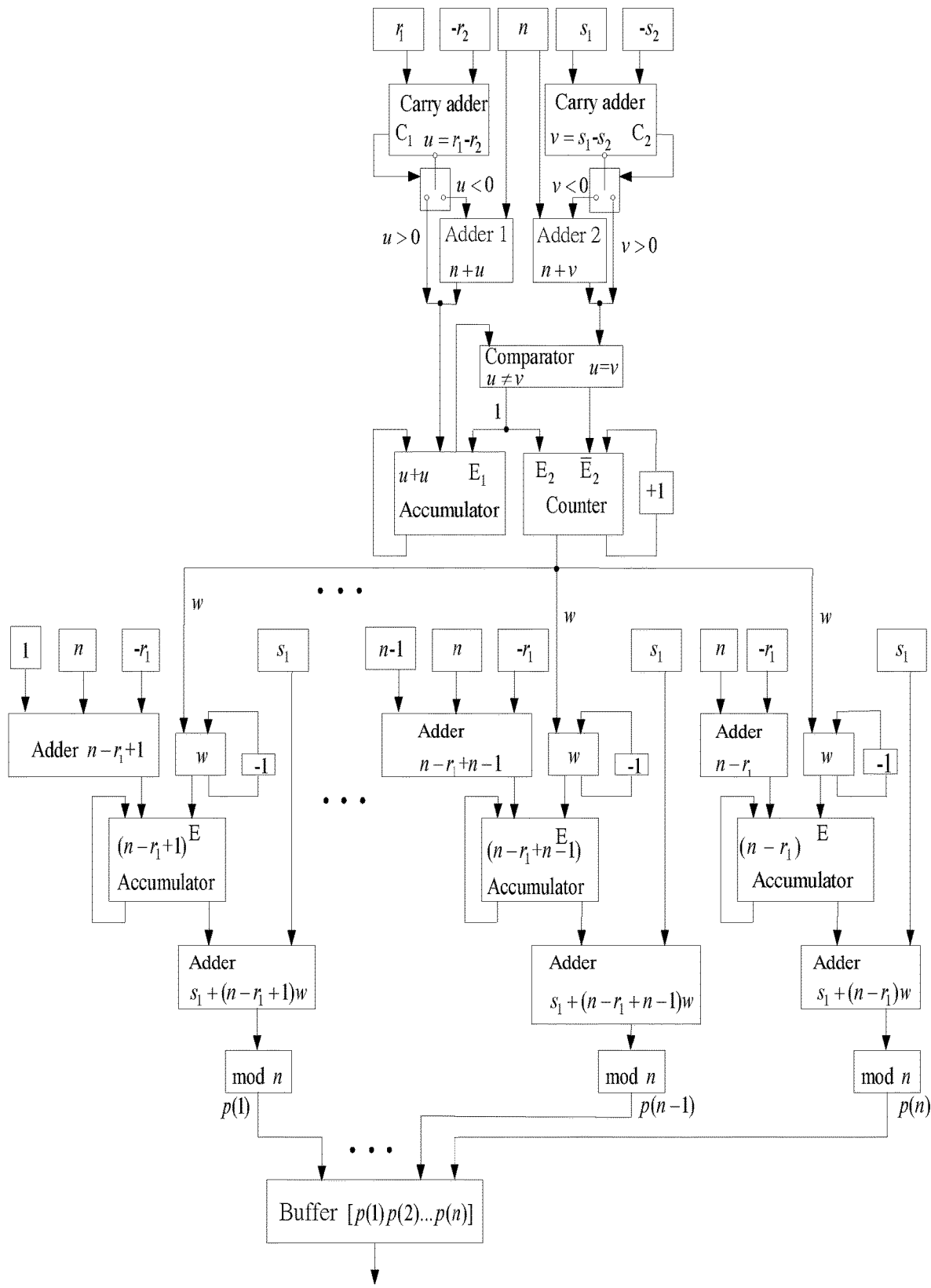
FIG. 7 is a schematic diagram of the architecture of a complete algebraic decoder provided by the disclosure.

An optional architecture of the complete algebraic decoder is mainly composed of a simplified w calculator, n simplified single-code-element calculators operating in parallel and a n-input and single-output buffer, shown in FIG. 7.

The signal flow of the architecture of the complete algebraic decoder is described as follows: the w value of the simplified intermediate parameter w calculator enters the n counters with the w cycle-minus-one operation operating in parallel, respectively; when the accumulators in the n simplified single-code-element calculators operating in parallel acquire the output results $(n-r_1+i)$ of the three-input adder, where i=1, 2, . . . , n, the respective counter with the w cycle-minus-one operation provides an enable signal E=1 for each cycle-minus-one operation, so that the accumulator performs the accumulation operation on $(n-r_1+i)$ once, until w in the counter with the cycle-minus-one operation of w is reduced to 0, and then the accumulator stops the accumulation operation and outputs a calculation result $(n-r_1+i)w$; the calculation result $(n-r_1+i)w$ and $s_1$ are input together to the two-input adder to achieve an operation of $s_1+(n-r_1+i)w$; a modulo n operation is performed on the operation result of the two-input adder; finally, the output results of the n simplified single-code-element calculators operating in parallel are input to a n-dimensional buffer to form a decode codeword p=[p(1)p(2) . . . p(n)].

It should be readily understood to those skilled in the art that the above description is only preferred embodiments of the present disclosure, and does not limit the scope of the present disclosure. Any change, equivalent substitution and modification made without departing from the spirit and scope of the present disclosure should be included within the scope of the protection of the present disclosure.

What is claimed is:

1. An algebraic decoding method for a (n, n(n-1), n-1) permutation group code in a communication modulation system, wherein when n is a prime number, the (n, n(n-1), n-1) permutation group code contains n(n-1) permutation codewords, each of the permutation codewords contains n code elements, and a minimum Hamming distance between any two of the permutation codewords is n-1, comprising:
    i) determining an intermediate parameter w: let w∈$Z_n$ be obtained by solving an expression $(r_1-r_2)w=(s_1-s_2)$ (mod n), wherein (mod n) represents a modulo n operation; let $p(r_1)=s_1$ and $p(r_2)=s_2$ be two of the code elements correctly detected in a real signal vector received from a channel, wherein $s_1$, $s_2$∈$Z_n$ are respectively element values of the code elements $p(r_1)$ and $p(r_2)$, $r_1$, $r_2$∈$Z_n$ are respectively position indices of the code elements $p(r_1)$ and $p(r_2)$, and $Z_n$ is a positive integer finite domain represented by $Z_n$={1, 2, . . . , n}; and both the code elements $p(r_1)$ and $p(r_2)$ are elements in a permutation codeword p with a code length of n;
    ii) calculating respective code elements in the permutation codeword p by using the intermediate parameter w determined in i) and the detected parameters $r_1$ and $s_1$ according to an expression $p(i)=(s_1+(n-r_1+i)w)(\text{mod } n)$, wherein p(i) represents an element value of a code element at a position index i, and i=1, 2, . . . , n; and
    iii) constructing a vector with a length of n by arranging the n code elements calculated in ii) in an order of i=1, 2, . . . , n, to obtain a decoded codeword p=[p(1)p(2) . . . p(n-1)p(n)].

2. A decoder for a (n, n(n-1), n-1) permutation group code in a communication modulation system, comprising a plurality of independent n-dimensional registers, an intermediate parameter w calculator, n single-code-element calculators operating in parallel, and a n-dimensional buffer for n code elements, wherein the plurality of independent n-dimensional registers are respectively configured to store parameters $r_1$, $r_2$, $s_1$, $s_2$, n and a code element position index i; two code elements $p(r_1)=s_1$ and $p(r_2)=s_2$ are correctly detected in a real vector received from a channel, wherein $s_1$, $s_2 \in Z_n$ are respectively element values of the code elements $p(r_1)$ and $p(r_2)$, $r_1$, $r_2 \in Z_n$ are respectively position indices of the code elements $p(r_1)$ and $p(r_2)$, and $Z_n$ is a positive integer finite domain represented by $Z_n=\{1, 2, \ldots, n\}$; both the code elements $p(r_1)$ and $p(r_2)$ are elements in a permutation codeword p with a code length of n;

the intermediate parameter w calculator is configured to calculate an intermediate parameter w; let $w \in Z_n$ be obtained by solving an expression $(r_1-r_2)w=(s_1-s_2)$ (mod n), wherein (mod n) represents a modulo n operation; the intermediate parameter w calculator is implemented by a calculator with a divider, or is implemented by a calculator with carry adders and a counter according to a method for calculating the intermediate parameter w in a flowchart;

the n single-code-element calculators are configured to operate in parallel to simultaneously calculate n code elements in the permutation codeword p by using the intermediate parameter w and the detected parameters $r_1$ and $s_1$ according to an expression $p(i)=(s_1+(n-r_1+i)w)(\mod n)$, wherein p(i) represents an element value of a code element at a position index i, $i=1, 2, \ldots, n$, and a i-th single-code-element calculator is configured to calculate p(i); each of the n single-code-element calculators is implemented by a calculator with a multiplier, or a calculator with an accumulator and a counter; and the n-dimensional buffer for the n code elements are configured to store and arrange the n code elements calculated by the n single-code-element calculators in an order of $i=1, 2, \ldots, n$ to construct a vector with a length of n, thereby obtaining a decoded codeword $p=[p(1)p(2) \ldots p(n-1)p(n)]$.

3. The decoder according to claim 2, wherein when the intermediate parameter w calculator is implemented by the calculator with the divider, the intermediate parameter w calculator includes four independent n-dimensional registers, two two-input adders, a divider and a modulo n operator mod n, wherein the four independent n-dimensional registers are configured to respectively store $r_1$, $-r_2$, $s_1$ and $-s_2$;

two input ends of the left one of the two input adders are respectively connected to two of the four independent n-dimensional registers storing $r_1$ and $-r_2$, and two input ends of the right one of the two input adders are respectively connected to two of the four independent n-dimensional registers storing $s_1$ and $-s_2$;

a left input end of the divider is configured to receive an output $(r_1-r_2)$ of the left adder, a right input end of the divider is configured to receive an output $(s_1-s_2)$ of the right adder, and the divider outputs a result $(s_1-s_2)/(r_1-r_2)$; and the modulo n operator mod n is connected to an output end of the divider, and is configured to perform an modulo operation on the output result $(s_1-s_2)/(r_1-r_2)$ of the divider and output $w=(s_1-s_2)/(r_1-r_2)(\mod n)$.

4. The decoder according to claim 3, wherein the n-dimensional buffer comprises a n-input and single-output buffer, wherein when each of the n single-code-element calculators is implemented by the calculator with the multiplier, the i-th single-code-element calculator with the multiplier includes five independent n-dimensional registers, a three-input adder, a two-input multiplier, a two-input adder and a modulo n operator, wherein $i=1, 2, \ldots, n$, wherein the five independent n-dimensional registers are configured to respectively store i, n, $-r_1$, w and $s_1$;

output ends of three of the five independent n-dimensional registers storing i, n and $-r_1$ are respectively connected to three input ends of the three-input adder, and the three-input adder is configured to perform an add operation of $(n-r_1+i)$, wherein $i=1, 2, \ldots, n$;

an output end of the three-input adder is connected to one input end of the two-input multiplier, the other input end of the two-input multiplier is connected to one of the five independent n-dimensional register storing w, and the two-input multiplier is configured to perform an multiply operation of $(n-r_1+i)w$;

an output end of the two-input multiplier is connected to one input end of the two-input adder, the other input end of the two-input adder is connected to one of the five independent n-dimensional register storing $s_1$, and the two-input adder is configured to perform an add operation of $(s_1+(n-r_1+i)w)$; and an output end of the two-input adder is connected to the modulo n operator, and the modulo n operator is configured to perform an mod n operation on $(s_1+(n-r_1+i)w)$, and output an i-th code element p(i) in the decode codeword.

5. The decoder according to claim 3, wherein the n-dimensional buffer comprises a n-input and single-output buffer, wherein when each of the n single-code-element calculators is implemented by the calculator with the accumulator and the counter to form a simplified single-code-element calculator, the i-th simplified single-code-element calculator includes four n-dimensional registers, a three-input adder, an enable control accumulator, a counter with an intermediate parameter w cycle-minus-one operation, a two-input adder and a modulo n operator, wherein $i=1, 2, \ldots, n$, wherein the four n-dimensional registers of the i-th simplified single-code-element calculator are configured to respectively store i, n, $-r_1$ and $s_1$;

output ends of three of the four n-dimensional registers of the i-th simplified single-code-element calculator storing i, n and $-r_1$ are respectively connected to three input ends of the three-input adder to achieve an add operation of $(n-r_1+i)$;

an operation result of the three-input adder is input to the enable control accumulator to achieve w times of accumulation of $(n-r_1+i)$, wherein an operation of $w-1$ is performed for each accumulation; when $w \neq 0$, the enable control accumulator has an enable signal $E=1$, so that the enable control accumulator continues to perform the accumulation operation on $(n-r_1+i)$, until w is reduced to 0, and then the enable control accumulator has an enable signal $E=0$, so that the accumulator stops the accumulation operation and outputs a result to one input end of the two-input adder;

the other input end of the two-input adder is connected to one of the four n-dimensional register of the i-th simplified single-code-element calculator storing $s_1$, and the two-input adder is configured to perform an add operation of $(s_1+(n-r_1+i)w)$; and an output end of the two-input adder is connected to connected to the modulo n operator, and the modulo n operator is configured to perform an mod n operation on $(s_1+(n-r_1+i)w)$, and output an i-th code element p (i) in the decode codeword.

6. The decoder according to claim 2, wherein the method for calculating for the intermediate parameter w in the flowchart comprises:
inputting the position values $r_1$, $r_2$ and the element values $s_1$, $s_2$ of the two known code elements $p(r_1)=s_1$ and $p(r_2)=s_2$, and initializing the intermediate parameter w=1;
respectively calculating $u=r_1-r_2$ and $v=s_1-s_2$;
respectively determining values of u and v: if u>0, directly outputting a value of u, and if u<0, then u=n+u, outputting a value of u; similarly, if v>0, directly outputting a value of v, and if v<0, then v=n+v, outputting a value of v; and
comparing the values of u and v, if u=v, then outputting w=1; if u≠v, then u=u+u, w=w+1, comparing the values of u and v again, if u≠v, continuing the operations of u=u+u and w=w+1, until u=v, then outputting w>1.

7. The decoder according to claim 6, wherein when the intermediate parameter w calculator is implemented by the calculator with carry adders and the counter to form a simplified calculator, the simplified intermediate parameter w calculator includes five n-dimensional registers, two adders with carry bit C, two single-input and double-output switches, two two-input adders, a comparator, an enable control accumulator, and an enable control counter with a feedback-plus-one operation,
wherein the five n-dimensional registers are respectively store $r_1$, $-r_2$, $s_1$, $-s_2$ and n;
the enable control counter with a feedback-plus-one operation has an initial value set to w=1;
output ends of two of the five n-dimensional registers storing $r_1$ and $-_2$ are respectively connected to two input ends of the left adder with carry bit $C_1$ to obtain a calculation result $u=r_1-r_2$, if u<0, then the carry bit $C_1=1$, the left single-input and double-output switch is thrown to the right, u is output to the left two-input adder to achieve u=n+u, and u is output; if u>0, then the carry bit $C_1=0$, the left single-input and double-output switch is thrown to the left, and $u=r_1-r_2$ is output; u enters the comparator through the enable control accumulator;
output ends of two of the five n-dimensional registers storing $s_1$ and $-s_2$ are respectively connected to two input ends of the right adder with carry bit $C_2$ to obtain a calculation result $v=s_1-s_2$, if v<0, then the carry bit $C_2=1$, the right single-input and double-output switch is thrown to the left, v is output to the right two-input adder to achieve v=n+v, and v is output; if u>0, then the carry bit $C_2=0$, the right single-input and double-output switch is thrown to the right, and $v=s_1-s_2$ is output; v directly enters the comparator; and
the comparator compares values of u and v: if u=v, then a low-level enable signal is output, so that the enable control counter has an enable signal $\overline{E}_2=1$, and directly outputs w=1 without the feedback-plus-one operation; if u≠v, the enable control accumulator has an enable signal $E_1=1$, and returns the current u to its input end for accumulating u once, if $E_1=0$, the enable control accumulator directly outputs u to the comparator without performing the accumulation operation; if u≠v, the enable control counter has an enable signal $E_2=1$, so that the feedback-plus-one operation is performed on the current w; as long as u≠v, the comparator, the enable control accumulator and the enable control counter repeat the above operations until u=v, resulting in $\overline{E}_2=1$, and $E_1=0$, that is, the enable control accumulator does not perform the accumulation operation and the enable control counter does not perform the feedback-plus-one operation, and then a value of w is output.

8. The decoder according to claim 7, wherein the n-dimensional buffer comprises a n-input and single-output buffer,
wherein when each of the n single-code-element calculators is implemented by the calculator with the multiplier, the i-th single-code-element calculator with the multiplier includes five independent n-dimensional registers, a three-input adder, a two-input multiplier, a two-input adder and a modulo n operator, wherein i=1, 2, . . . , n,
wherein the five independent n-dimensional registers of the i-th single-code-element calculator with the multiplier are configured to respectively store i, n, $-r_1$, w and $s_1$;
output ends of three of the five independent n-dimensional registers of the i-th single-code-element calculator with the multiplier storing i, n and $-r_1$ are respectively connected to three input ends of the three-input adder, and the three-input adder is configured to perform an add operation of $(n-r_1+i)$, wherein i=1, 2, . . . , n;
an output end of the three-input adder is connected to one input end of the two-input multiplier, the other input end of the two-input multiplier is connected to one of the five independent n-dimensional register of the i-th single-code-element calculator with the multiplier storing w, and the two-input multiplier is configured to perform an multiply operation of $(n-r_1+i)w$;
an output end of the two-input multiplier is connected to one input end of the two-input adder, the other input end of the two-input adder is connected to one of the five independent n-dimensional register of the i-th single-code-element calculator with the multiplier storing $s_1$, and the two-input adder is configured to perform an add operation of $(s_1+(n-r_1+i)w)$; and
an output end of the two-input adder is connected to the modulo n operator, and the modulo n operator is configured to perform an mod n operation on $(s_1+(n-r_1+i)w)$, and output an i-th code element p(i) in the decode codeword.

9. The decoder according to claim 7, wherein the n-dimensional buffer comprises a n-input and single-output buffer,
wherein when each of the n single-code-element calculators is implemented by the calculator with the accumulator and the counter to form a simplified single-code-element calculator, the i-th simplified single-code-element calculator includes four n-dimensional registers, a three-input adder, an enable control accumulator, a counter with an intermediate parameter w cycle-minus-one operation, a two-input adder and a modulo n operator, wherein i=1, 2, . . . , n,
wherein the four n-dimensional registers are configured to respectively store i, n, $-r_1$ and $s_1$;
output ends of three of the four n-dimensional registers storing i, n and $-r_1$ are respectively connected to three input ends of the three-input adder to achieve an add operation of $(n-r_1+i)$;
an operation result of the three-input adder is input to the enable control accumulator to achieve w times of accumulation of $(n-r_1+i)$, wherein an operation of w−1 is performed for each accumulation; when w≠0, the enable control accumulator has an enable signal E=1, so that the enable control accumulator continues to perform the accumulation operation on $(n-r_1+i)$, until w is reduced to 0, and then the enable control accumulator has an enable signal E=0, so that the accumulator stops the accumulation operation and outputs a result to one input end of the two-input adder;

the other input end of the two-input adder is connected to one of the four n-dimensional register storing $s_1$, and the two-input adder is configured to perform an add operation of $(s_1+(n-r_1+i)w)$; and an output end of the two-input adder is connected to connected to the modulo n operator, and the modulo n operator is configured to perform an mod n operation on $(s_1+(n-r_1+i)w)$, and output an i-th code element p(i) in the decode codeword.

10. The decoder according to claim 2, wherein when each of the n single-code-element calculators is implemented by the calculator with the multiplier, the i-th single-code-element calculator with the multiplier includes five independent n-dimensional registers, a three-input adder, a two-input multiplier, a two-input adder and a modulo n operator, wherein i=1, 2, . . . , n, wherein the five independent n-dimensional registers are configured to respectively store i, n, $-r_1$, w and $s_1$;

output ends of three of the five independent n-dimensional registers storing i, n and $-r_1$ are respectively connected to three input ends of the three-input adder, and the three-input adder is configured to perform an add operation of $(n-r_1+i)$, wherein i=1, 2, . . . , n;

an output end of the three-input adder is connected to one input end of the two-input multiplier, the other input end of the two-input multiplier is connected to one of the five independent n-dimensional register storing w, and the two-input multiplier is configured to perform an multiply operation of $(n-r_1+i)w$;

an output end of the two-input multiplier is connected to one input end of the two-input adder, the other input end of the two-input adder is connected to one of the five independent n-dimensional register storing $s_1$, and the two-input adder is configured to perform an add operation of $(s_1+(n-r_1+i)w)$; and an output end of the two-input adder is connected to the modulo n operator, and the modulo n operator is configured to perform an mod n operation on $(s_1+(n-r_1+i)w)$, and output an i-th code element p(i) in the decode codeword.

11. The decoder according to claim 2, wherein when each of the n single-code-element calculators is implemented by the calculator with the accumulator and the counter to form a simplified single-code-element calculator, the i-th simplified single-code-element calculator includes four n-dimensional registers, a three-input adder, an enable control accumulator, a counter with an intermediate parameter w cycle-minus-one operation, a two-input adder and a modulo n operator, wherein i=1, 2, . . . , n, wherein the four n-dimensional registers are configured to respectively store i, n, $-r_1$ and $s_1$;

output ends of three of the four n-dimensional registers storing i, n and $-r_1$ are respectively connected to three input ends of the three-input adder to achieve an add operation of $(n-r_1+i)$;

an operation result of the three-input adder is input to the enable control accumulator to achieve w times of accumulation of $(n-r_1+i)$, wherein an operation of w−1 is performed for each accumulation; when w≠0, the enable control accumulator has an enable signal E=1, so that the enable control accumulator continues to perform the accumulation operation on $(n-r_1+i)$, until w is reduced to 0, and then the enable control accumulator has an enable signal E=0, so that the accumulator stops the accumulation operation and outputs a result to one input end of the two-input adder;

the other input end of the two-input adder is connected to one of the four n-dimensional register storing $s_1$, and the two-input adder is configured to perform an add operation of $(s_1+(n-r_1+i)w)$; and an output end of the two-input adder is connected to connected to the modulo n operator, and the modulo n operator is configured to perform an mod n operation on $(s_1+(n-r_1+i)w)$, and output an i-th code element p(i) in the decode codeword.

\* \* \* \* \*